United States Patent
Baeumel et al.

(10) Patent No.: US 7,215,023 B2
(45) Date of Patent: May 8, 2007

(54) POWER MODULE

(75) Inventors: Hermann Baeumel, Neumarkt (DE);
Werner Graf, Nuremberg (DE);
Hermann Kilian, Diespeck (DE);
Bernhard Wagner, Nuremberg (DE);
Dietrich George, Bayreuth (DE);
William T. Briggs, Livonia, MI (US)

(73) Assignee: Conti Temic microelectronic GmbH, Nuremberg (DE)

( * ) Notice: Subject to any disclaimer, the term of this patent is extended or adjusted under 35 U.S.C. 154(b) by 22 days.

(21) Appl. No.: 10/503,254

(22) PCT Filed: Nov. 28, 2002

(86) PCT No.: PCT/EP02/13423

§ 371 (c)(1),
(2), (4) Date: Jul. 29, 2004

(87) PCT Pub. No.: WO03/065469

PCT Pub. Date: Aug. 7, 2003

(65) Prior Publication Data

US 2005/0168197 A1 Aug. 4, 2005

(30) Foreign Application Priority Data

Feb. 1, 2002 (DE) ............................... 102 04 200

(51) Int. Cl.
*H01L 23/34* (2006.01)

(52) U.S. Cl. .............................. 257/724; 257/E25.029; 361/717; 361/738

(58) Field of Classification Search ................ 257/724, 257/E25.029; 361/717, 738
See application file for complete search history.

(56) References Cited

U.S. PATENT DOCUMENTS

| 3,766,440 | A | | 10/1973 | Baird |
| 3,908,184 | A | * | 9/1975 | Anazawa et al. ............. 257/99 |
| 5,134,094 | A | | 7/1992 | Schovanec |
| 5,245,510 | A | * | 9/1993 | Honda ........................ 361/718 |

(Continued)

FOREIGN PATENT DOCUMENTS

DE 19735074 9/1998

(Continued)

OTHER PUBLICATIONS

Charles A. Harper, Electronic Packaging and Interconnection Handbook, 1991, McGraw-Hill, Inc., Chapter 7: pp. 7.1,7.2,7.3,7.16,7.17,7.18,7.26.*
IBM Technical Disclosure Bulletin, XP-002237832, "Ceramic Substrate With Inherent Heat Exchanger", H. R. Pilgrim, vol. 12, No. 5, Oct. 1969.

*Primary Examiner*—Minhloan Tran
*Assistant Examiner*—Eduardo A. Rodela
(74) *Attorney, Agent, or Firm*—W. F. Fasse; W. G. Fasse

(57) ABSTRACT

A power module includes at least one carrier body for mounting at least one power component thereon, and at least one energy storage component. For this purpose, a hybrid circuit is arranged as a thick film circuit on at least one of the carrier bodies, and the hybrid circuit includes at least one thick film resistor as a discharging resistor for discharging the at least one energy storage component. The power module is adapted for use as a power converter for electric motors.

19 Claims, 2 Drawing Sheets

U.S. PATENT DOCUMENTS

| | | | |
|---|---|---|---|
| 5,294,831 A | | 3/1994 | Azar et al. |
| 5,491,370 A | | 2/1996 | Schneider et al. |
| 5,585,681 A | | 12/1996 | Bitsche |
| 5,966,291 A | | 10/1999 | Baeumel et al. |
| 6,111,494 A | * | 8/2000 | Fischer et al. ............... 338/320 |
| 6,140,571 A | | 10/2000 | Kitahara et al. |
| 6,166,464 A | | 12/2000 | Grant |
| 6,194,856 B1 | * | 2/2001 | Kobayashi et al. ......... 318/432 |
| 6,198,183 B1 | | 3/2001 | Baeumel et al. |
| 6,580,590 B2 | * | 6/2003 | Holmquist et al. ........... 361/31 |
| 6,661,659 B2 | * | 12/2003 | Tamba et al. ............... 361/699 |
| 2002/0008967 A1 | | 1/2002 | Feustel et al. |
| 2004/0057208 A1 | | 3/2004 | Baeumel et al. |

FOREIGN PATENT DOCUMENTS

| | | |
|---|---|---|
| GB | 2 261 549 | 5/1993 |
| JP | 57-69768 | 4/1982 |
| JP | 2-276264 | 11/1990 |

* cited by examiner

POWER MODULE

FIELD OF THE INVENTION

The invention relates to a power module with a power component and an energy storage component.

BACKGROUND INFORMATION

In many fields, electronic assemblies are utilized for various different purposes and applications; especially, in connection with a high power demand of the electronic assemblies (that is to say with a power demand in the kilowatt range), electronic assemblies embodied as power modules are useful for controlled activation purposes, for example for the rotational speed and power regulation of electric motors. These power modules, which are often driven with high supply voltages above the low voltage range (that is to say with supply voltages>60V) require components for processing and storing the high energy quantities arising in the operation of the power module, as well as for signal transmission of control signals and/or measured signals; therefore especially both active components such as power components operating in the switching operation with high current variation speeds (power switches for switching large loads) as well as passive components such as resistances or resistors (for example shunts for current measurement) and at least one capacitor for energy storage and for smoothing of the supply voltage are provided. For realizing a low-inductance construction (avoidance of overvoltages), the power components are typically applied on at least one insulating carrier body (at least one insulating substrate), which generally consists of a ceramic material. For mechanical stabilization and for heat removal of the dissipation or loss power of the components of the power module (especially of the power components), the at least one carrier body is applied or mounted on a metallic cooling body (for example a copper plate or aluminum plate) that is, for example, connected to a cooling system with a cooling circuit, and thermally connected thereto. The power module is typically connected with further components or assemblies for the voltage supply and/or for the signal transmission via at least one connector plug.

For various operating conditions of the power module, for example when removing connector plugs in the case of maintenance, it is necessary for safety reasons to reduce the voltage present in the power module as quickly as possible to a safe or not-dangerous (especially to a non-life-threatening) potential; as a result, the high energy quantity stored in the power module should be removed (nullified) within a short time, that is to say, the at least one capacitor utilized for the energy storage should be able to be quickly discharged if necessary.

SUMMARY OF THE INVENTION

It is the underlying object of the invention to set forth a power module that can be produced in a simple manner with low costs and with a simple construction, advantageous thermal characteristics, a high reliability, and a high operating safety.

This object is achieved according to the invention as set forth in the appended claims. Advantageous embodiments of the invention are the subject of the dependent patent claims.

For ensuring a high operating safety in all operating conditions of the power module, the power module comprises a discharging circuit, which is activatable via a switching element, and through which, when required, after its activation, the energy stored in at least one component as an energy store (especially in at least one capacitor) is dissipated or removed in a discharging process via a discharging resistor, that is realized in the form of at least one thick film resistor; the at least one thick film resistor is arranged in a hybrid circuit embodied as a thick film circuit on at least one of the carrier bodies provided for receiving or mounting the power components. Depending on the energy quantity that is to be dissipated or removed in the discharging process, and the dissipation or loss power resulting therefrom, a certain resistance value is given for the discharging resistor; depending on the resistance value and therewith necessary surface area requirement for the discharging resistor, this discharging resistor can be divided into plural parallel-connected partial resistors that are each embodied as thick film resistors, that are arranged in at least one hybrid circuit embodied as a thick film circuit at a suitable location on at least one carrier body. Thereby, the total dissipation power that is to be dissipated is divided among all parallel-connected partial resistors corresponding to their resistance value, and thereby the proportion being allocated to each partial resistor is reduced in comparison to the total dissipation power that is to be dissipated; for example, in connection with a division of the discharging resistor into several partial resistors with equal resistance values, the total dissipation power to be dissipated is divided in equal portions onto all of the parallel-connected partial resistors. In connection with the division of the discharging resistor into plural partial resistors, in a power module comprising plural carrier bodies for the power components, these partial resistors can be arranged either in one hybrid circuit or in plural hybrid circuits either on one carrier body or on plural carrier bodies depending on the surface areas available on the carrier bodies and depending on the surface area requirement of the partial resistors; especially, a hybrid circuit can be arranged as a thick film circuit on each carrier body, whereby each thick film circuit comprises a partial resistor of the discharging resistor as a thick film resistor.

Further components, especially the switching element preferably embodied as a switching transistor (for example as a MOSFET) for the activation of the discharging circuit and/or sensors of the power module, for example at least one temperature sensor for the thermal monitoring of the power components, can be allocated to the hybrid circuits receiving or containing the at least one thick film resistor. The at least one carrier body for receiving or mounting the power components and the hybrid circuits consists of an insulating material with high thermal conductivity, especially as a ceramic carrier body (ceramic substrate) of a ceramic material, for example of aluminum oxide $Al_2O_3$ or aluminum nitride AlN. A (metallic) conductor path structure with conductor paths, mounting surfaces, contact points or locations, and connection surfaces is directly applied on the top surface of the carrier body (that is to say without intermediate layers on the surface of the carrier body), especially through the DCB method ("Direct Copper Bonding") or through active soldering ("Active Metal Bonding"). Components, especially the power components embodied for example in the form of silicon chips, are applied on the mounting surfaces of the conductor path structure (for example soldered by means of soft solder or pressed-on), whereby the components are contacted with one another and/or with the conductor path structure, if applicable via contact elements, especially by means of wire bonding through contacting of the terminals of the components with contact locations of the conductor path structure or with terminals of further components via contact elements embodied as bond wires. The hybrid circuits are applied at a suitable location on the carrier body provided for this purpose, depending on the space requirement, for example through adhesive bonding or soft soldering. The connection surfaces of the conductor path structure are connected with connection contacts (for example with connection pins) if applicable via contact elements; connector plugs for the voltage supply of the power module and/or for the connection of the power module with further assemblies or components can be connected to the connection contacts. The bottom surface (for example provided with a metallization layer over the entire surface) of the at least one carrier body is applied on a cooling body of a material with a high thermal conductivity (especially the at least one carrier body is soldered onto the cooling body), via which cooling body the heat removal of the dissipation or loss power of the components of the power module is ultimately carried out; the cooling body is especially connected to a cooling system, for example being integrated in a cooling circuit of the cooling system, so that the cooling medium or coolant of the cooling circuit (especially the water or the air) flows around the cooling body.

The power module incorporates and unites plural advantages: at least one carrier body serves simultaneously as a substrate for components and for at least one hybrid circuit; through the direct connection of the hybrid circuit and therewith of the at least one thick film resistor for realizing the discharging resistor via the respective carrier body to the cooling system (especially to a cooling body and if applicable to a cooling circuit), a good thermal connection of the at least one thick film resistor and therewith of all power components of the power module is made possible, and a good heat removal or dissipation (removal or dissipation of the dissipation power) is realized, so that a high reliability and operating life of the power module is provided.

Through the embodiment of the thick film resistors (especially through the specifying or fixing of the geometry of the thick film resistors), the resistance value of the discharging resistor and of the partial resistors, and therewith the dissipatable or removable dissipation power can be variably adapted to the requirements; particularly, a suitable division of the discharging resistor into partial resistors can be selected corresponding to the surface area available on the respective carrier body for mounting of hybrid circuits and therewith also for the thick film resistors, whereby the total space requirement needed for the power module can be kept small, especially if still further components are incorporated in the hybrid circuits depending on space requirement and functionality.

The manufacturing effort and expense is small, since a simple manufacturing of the hybrid circuit as a thick film circuit is possible with standard processes (especially also through the use of simple and economical materials), and since the contacting of the thick film resistors can be carried out by means of a contacting method also utilized for the remaining components of the power module in the same method step with the same contacting elements, for example through wire bonding with bond wires.

BRIEF DESCRIPTION OF THE DRAWINGS

In connection with the drawing (FIGS. 1 to 3), the power module shall be described in detail in connection with an example embodiment. Hereby it is shown in.

DETAILED DESCRIPTION OF AN EXAMPLE EMBODIMENT OF THE INVENTION

Figures 1, 2:
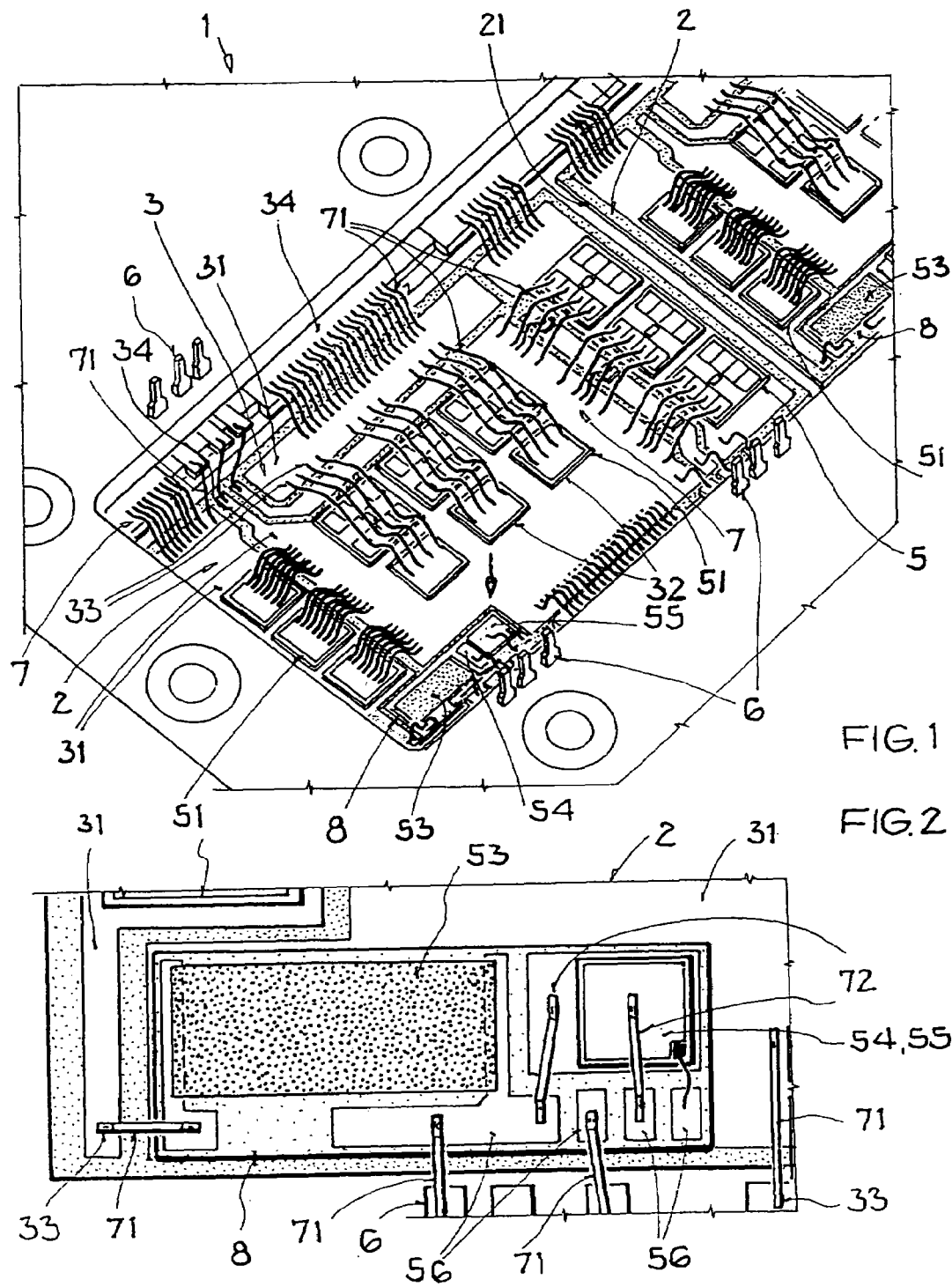
FIG. 1 in a cut-away portion, a top plan view onto the top surface of the power module.
FIG. 2 one of the hybrid circuits of the power module in an enlarged cut-away portion of FIG. 1.

The power module 1 is, for example, utilized as a power converter for liquid cooled electric motors in the motor vehicle field (power for example 10 kW); due to the high dissipation power in the operation of the power converter 1, the power converter 1 is, for example, coupled directly on the electric motor to its cooling system 4.

Plural carrier bodies 2 (ceramic substrates) of the power converter 1 consisting of a ceramic material (for example of AlN), with the dimensions of respectively e.g. 65 mm×42 mm×1.3 mm, are arranged one behind another on the cooling body 41 of the cooling system 4; for example three ceramic substrates as carrier bodies 2 are arranged one behind another on the cooling body 41. Furthermore, a circuit board 10 is provided as a carrier body for components of a control unit provided for the controlled activation of the power converter 1.

Respectively one conductor path structure 3, for example consisting of copper (thickness for example 0.3 mm), having conductor paths 31, mounting surfaces 32, contact locations 33, and connection surfaces 34, is applied or mounted on the top surface 21 of the carrier body 2, for example being soldered onto the carrier body 2 by means of the DCB method. At particular contact locations 33 of the conductor path structure 3, the components 5 are contacted with the conductor path structure 3, that is to say are electrically conductively connected with conductor paths 31 and/or with connection surfaces 34 of the conductor path structure 3, for example via bond wires 71; certain connector surfaces 34 of the conductor path structure 3 run or transition into connection contacts 6, for example embodied as connection pins.

Power components or power semiconductor elements 51 for realizing the conversion function and the controlled activation of the electric motor arising here from, a capacitor 52 for energy storage and for smoothing the supply voltage, and a temperature sensor 54 for thermal monitoring of the power components 51 are provided as components 5 of the power converter 1, as well as a discharging resistor for the rapid discharging in a discharging process of the energy stored in the capacitor 52, and a switching transistor 55 for the activation of the discharging process, as components of a discharging circuit of the power converter 1. The power components 51 are applied or mounted, for example as silicon chips, to certain mounting surfaces 32 on the conductor path structure 3 (for example being soldered by means of a soft solder process), and are connected, for example via bond wires 71 as contact elements 7, with contact locations 33 of the conductor paths 31 of the conductor path structure 3 and/or with connection surfaces 34 of the conductor path structure 3 and/or with other components 5. Connector plugs can be applied to the connection contacts 6 embodied as connection pins for the external connection of the power converter 1, especially to the voltage supply and to the signal line of control signals, especially for the connection of the power converter 1 with a voltage source and/or with the motor phase connections of the electric motor. A hybrid circuit 8 is applied as a thick film circuit on each of the carrier bodies 2, whereby each of the hybrid circuits 8 comprises at least one thick film resistor 53 as a partial resistor of the discharging resistor. Accordingly, for example, three hybrid circuits 8 are provided for the three carrier bodies 2 (DCB substrates), whereby one of the hybrid circuits 8, in addition to the thick film resistor 53, still further comprises the switching transistor embodied as a chip as the switching element 55 (for example a MOSPET), and one of the hybrid circuits 8, in addition to the thick film resistor 53, still further comprises the sensor 54 embodied as a temperature sensor.

The (internal) contacting within the respective hybrid circuit 8, that is to say the contacting of the thick film resistor 53 on the respective hybrid circuit 8, of the switching transistor 55 and of the temperature sensor 54, is carried out either directly via the thick film conductor paths 56 printed onto the respective hybrid circuit 8, or by wire bonding by means of bond wires 72 between thick film resistor 53, switching transistor 55, temperature sensor 54 on the one hand, and thick film conductor paths 56 on the other hand. The (external) contacting of the respective hybrid circuit 8 is carried out by wire bonding by means of bond wires 71 between thick film conductor paths 56 and contact locations 33 on the conductor path structure 3 and/or connection contacts 6. The dissipation power that is to be dissipated through the discharging resistor in the discharging process of the stored energy amounts to, for example, 50 W, so that a resistance value of the discharging resistor of, for example, 75 ohms is needed; this resistance value is divided with equal divided portions through a parallel circuit connection among the three thick film resistors 53 of the three hybrid circuits 8 as parallel-connected partial resistors, so that the resistance value of each thick film resistor 53 as a partial resistor thus amounts to, for example, 225 ohms.

Figure 3:
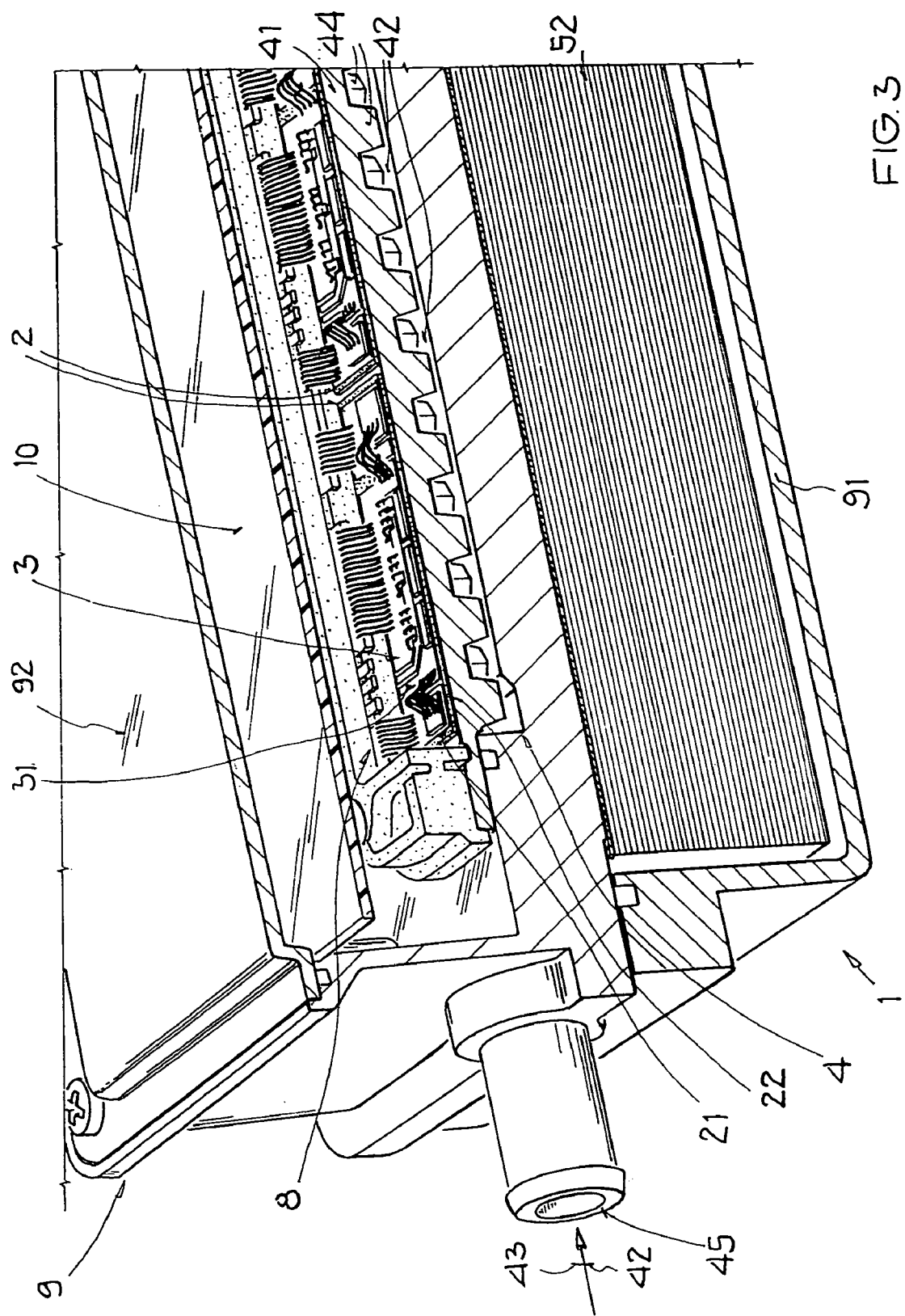
FIG. 3 a sectional illustration of the power module.

The dissipation power of the components 5 of the power converter 1 (especially of the power components 51 and of the thick film resistors 53) is removed or dissipated via the carrier body 2 and the cooling body 41 into the cooling circuit 43 of the cooling system 4, which has the cooling medium or coolant 42, for example water or a water-glycol mixture flowing therethrough. For this purpose, the bottom surface 22 of the carrier body 2, which is provided with a metallization layer, is applied onto the cooling body 41, which consists of, for example, aluminum silicon carbide (AlSiC), and which is provided on its bottom surface with rhombuses 44 (thickness of the cooling body 41 for example 9 mm); for example the carrier body 2 is soldered onto the cooling body 41, for example in a common soldering process together with the solder-mounting of the components 5 onto the top surface 21 of the carrier body 2. Electric motor and power converter 1 both use, for example, the cooling circuit 43 existing in connection with the internal combustion engine; the coolant 42 of the cooling circuit 43 is guided via the coolant inlet 45 through the power converter 1, and is delivered back into the cooling circuit 43 through the coolant outlet (this is not shown in the FIG. 3) for example on the same side as the coolant inlet 45 or on the opposite side of the coolant inlet 45. The cooling of the electric motor is carried out, for example, as "series cooling" in the cooling circuit 43, either before or after the power converter 1.

The housing 9 of the power converter 1 is embodied as three parts, with the housing middle part as a carrier, the housing top part 92 (housing cover or lid), and the capacitor 52 provided for the energy storage, which is mounted with a backside of its housing on the housing middle part and thus in contact with the cooling circuit 43 (for example being screwed on), and thus represents the housing bottom part 91 (the housing floor) of the power converter 1. The housing top part 92 (the housing cover or lid) serves for sealing the power converter 1 and for protecting the power converter 1 from external influences.

The invention claimed is:

1. Power module (1) with at least one carrier body (2) including a first carrier body with conductor paths thereon, at least one power semiconductor element mounted on said conductor paths on said first carrier body, and at least one component (52) as an energy store, characterized in that a hybrid circuit (8) is arranged as a thick film circuit on said first carrier body, which hybrid circuit comprises at least one thick film resistor (53) as a discharging resistor for discharging the at least one component (52) provided as an energy store.

2. Power module according to claim 1, characterized in that the discharging resistor is divided into at least two parallel-connected partial resistors, and in that the partial resistors are arranged as thick film resistors (53) in at least one hybrid circuit (8) on at least one of the carrier bodies (2).

3. Power module according to claim 1, characterized in that at least one hybrid circuit (8) comprises at least one sensor (5).

4. Power module according to claim 3, characterized in that the sensor comprises a temperature sensor (54) for thermal monitoring of the at least one power semiconductor element (51).

5. Power module according to claim 1, characterized in that the hybrid circuit (8) is contacted with a conductor path structure (3) including said conductor paths on a top surface (21) of said first carrier body (2) via bond wires (71).

6. Power module according to claim 1, characterized in that the at least one carrier body (2) consists of an insulating material with high thermal conductivity.

7. Power module according to claim 6, characterized in that the at least one carrier body (2) consists of a ceramic material.

8. Power module according to claim 1, characterized in that the at least one carrier body (2) is arranged on a cooling body (41).

9. Power module according to claim 8, characterized in that the cooling body (41) is connected to a cooling system (4).

10. Power module according to claim 9, characterized in that the cooling body (41) is integrated in a cooling circuit (43) of the cooling system (4).

11. Power module according to claim 8, characterized in that the cooling body (41) is connected with a bottom surface (22) of the carrier body (2) via a metallization layer.

12. Power module according to claim 1, characterized in that a conductor path structure (3) including said conductor paths on a top surface (21) of the first carrier body (2) further includes mounting surfaces (32) for mounting the at least one power semiconductor element (51), contact locations (33) for contacting the at least one power semiconductor element (51), and connection surfaces (34) for connecting contacting elements (71) and/or connection contacts (6).

13. Power module according to claim 1, characterized in that a hybrid circuit (8) comprises a switching element (55) for the controlled activation of the discharging process for discharging the at least one component (52) provided as an energy store.

14. Power module according to claim 13, characterized in that the switching element (55) is embodied as a switching transistor.

15. A power module comprising:
a first carrier body;
a conductor path structure provided on a surface of said first carrier body;
a power semiconductor element mounted directly onto said conductor path structure on said first carrier body;
an energy storage component;
a conductive circuit that includes a switching element; and
a thick film discharging resistor included in a hybrid thick film circuit arranged on said first carrier body, wherein said thick film discharging resistor is connected selectively through said switching element to said energy storage component so as to completely discharge energy stored in said energy storage component.

16. The power module according to claim 15, further comprising a cooling body on which said first carrier body is arranged, and wherein said switching element is also included in said hybrid thick film circuit arranged on said first carrier body.

17. The power module according to claim 15, wherein said thick film discharging resistor has a resistance of 75 Ω.

18. The power module according to claim 15, wherein said thick film discharging resistor has a resistance of 225 Ω.

19. Power module (1) with a carrier body (2) having conductor paths thereon and at least one power semiconductor element mounted directly on said conductor paths on said carrier body, and with at least one energy storage component (52), characterized in that a hybrid circuit (8) is arranged as a thick film circuit on said carrier body, which hybrid circuit comprises at least one thick film resistor (53) as discharging resistor means for completely discharging the at least one energy storage component (52).

* * * * *

UNITED STATES PATENT AND TRADEMARK OFFICE
CERTIFICATE OF CORRECTION

PATENT NO. : 7,215,023 B2
APPLICATION NO. : 10/503254
DATED : May 8, 2007
INVENTOR(S) : Baeumel et al.

It is certified that error appears in the above-identified patent and that said Letters Patent is hereby corrected as shown below:

Column 1,
Line 19, after "supply", replace "voltages>60V" by --voltages > 60V--;

Column 4,
Line 17, after "example", replace "10 kW" by --10kW--;
Line 23, after "e.g.", replace "65 mmx42" by --65mm x 42--;
Line 24, replace "mmx1.3 mm" by --mm x 1.3mm--;
Line 47, after "arising", replace "here from" by --herefrom--;

Column 5,
Line 11, after "example a", replace "MOSPET" by --MOSFET--;

Column 6,
Line 28, after "sensor", replace "(5)" by --(54)--.

Signed and Sealed this

Eleventh Day of March, 2008

JON W. DUDAS
*Director of the United States Patent and Trademark Office*